US012733335B2

(12) United States Patent
Lee et al.

(10) Patent No.: US 12,733,335 B2
(45) Date of Patent: Sep. 8, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Munjae Lee, Wuhan (CN); Guoqi Xia, Wuhan (CN); Yu Gu, Wuhan (CN); Fang Wang, Wuhan (CN); Kailong Wu, Wuhan (CN); Haoran Wang, Wuhan (CN); Qianhui Li, Wuhan (CN); Lin Yang, Wuhan (CN); Zhao Li, Wuhan (CN); Zhenmin Wang, Wuhan (CN); Ke Ding, Wuhan (CN); Huizhen Piao, Wuhan (CN); Danhua Shen, Wuhan (CN); Guo Cheng, Wuhan (CN); Yuanchun Wu, Wuhan (CN); Mingzhou Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 350 days.

(21) Appl. No.: 18/565,559

(22) PCT Filed: Oct. 31, 2023

(86) PCT No.: PCT/CN2023/128744
§ 371 (c)(1),
(2) Date: Nov. 30, 2023

(87) PCT Pub. No.: WO2025/065791
PCT Pub. Date: Apr. 3, 2025

(65) Prior Publication Data

US 2025/0113703 A1 Apr. 3, 2025

(30) Foreign Application Priority Data

Sep. 28, 2023 (CN) ......................... 202311280289.2

(51) Int. Cl.
*H10K 50/18* (2023.01)
*H10K 59/12* (2023.01)
*H10K 101/40* (2023.01)

(52) U.S. Cl.
CPC ............. *H10K 50/18* (2023.02); *H10K 59/12* (2023.02); *H10K 2101/40* (2023.02)

(58) Field of Classification Search
CPC . H10K 50/18; H10K 2101/40; H10K 2101/30
See application file for complete search history.

(56) References Cited

U.S. PATENT DOCUMENTS 10,079,365 B2 * 9/2018 Kim ..................... H10K 59/124
11,778,903 B2 * 10/2023 Ogita .................. C07D 513/04 257/40

(Continued)

*Primary Examiner* — Mounir S Amer
(74) *Attorney, Agent, or Firm* — PV IP PC; Wei Te Chung

(57) ABSTRACT

A display panel and a display device are provided. An organic light-emitting layer includes a doped region and an undoped region, and the undoped region is located between the doped region and the hole blocking layer. When the display panel is in a low grayscale display state, an exciton concentration distribution curve of the organic light-emitting layer includes a first peak located in the doped region and a second peak located in the undoped region, and a peak value of the second peak is less than a peak value of the first peak.

20 Claims, 6 Drawing Sheets

(56) References Cited

U.S. PATENT DOCUMENTS

| | | | | |
|---|---|---|---|---|
| 11,917,844 | B2 * | 2/2024 | Takaya | H05B 33/26 |
| 2012/0153268 | A1 * | 6/2012 | Kawamura | H10K 85/6572 257/E51.026 |
| 2013/0221337 | A1 * | 8/2013 | Sakuma | C09K 11/06 257/40 |
| 2015/0236300 | A1 * | 8/2015 | Naraoka | H10K 50/85 257/40 |
| 2022/0328782 | A1 * | 10/2022 | Zhang | H10K 50/13 |

* cited by examiner

DISPLAY PANEL AND DISPLAY DEVICE

CROSS REFERENCE TO RELATED APPLICATIONS

This application is a US national phase application based upon an International Application No. PCT/CN2023/128744, filed on Oct. 31, 2023, which claims the priority of Chinese Patent Application No. 202311280289.2, entitled "DISPLAY PANEL AND DISPLAY DEVICE", filed on Sep. 28, 2023, the disclosures of which are incorporated herein by reference in its entirety.

FIELD OF DISCLOSURE

The present disclosure relates to a field of display technology, in particular to a display panel and a display device.

BACKGROUND

Organic light emitting displays (OLEDs) have characteristics of self-illumination, fast response, wide visual angle, etc., and have a very broad application prospect, and have gradually replaced LCDs in a field of display.

An OLED display panel comprises a driving backplane and OLED light-emitting devices. The driving backplane can adjust currents entering the OLED light-emitting devices according to display requirements, thereby turning the OLED light-emitting devices on or off. The OLED light-emitting devices can emit lights of different wavelengths and different brightness to form different display images. As OLED light-emitting devices become more and more efficient, a current required to achieve a same brightness becomes smaller and smaller. When displaying a low grayscale image, a current required to enter the OLED light-emitting devices is smaller.

Furthermore, when the required current is less than a minimum current that the driving backplane can control, inaccurate current control will occur, resulting in display unevenness when the OLED display panel displays low grayscale images.

SUMMARY

An embodiment of the present disclosure provides a display panel and a display device, which can reduce luminous efficiency of a light-emitting device layer at low grayscales, so as to avoid display unevenness due to inaccurate current control.

An embodiment of the present disclosure provides a display panel. The display panel comprises a substrate, a thin-film transistor layer disposed on the substrate, and a light-emitting device layer disposed on a side of the thin-film transistor layer away from the substrate.

The light-emitting device layer comprises:

an anode electrode disposed on the side of the thin-film transistor layer away from the substrate an organic light-emitting layer disposed on a side of the anode electrode away from the thin-film transistor layer a hole blocking layer disposed on a side of the organic light-emitting layer away from the anode electrode;

a cathode electrode disposed on a side of the hole blocking layer away from the organic light-emitting layer.

The organic light-emitting layer comprises a doped region and an undoped region, and the undoped region is located between the doped region and the hole blocking layer. When the display panel is in a low grayscale display state, an exciton concentration distribution curve of the organic light-emitting layer comprises a first peak located in the doped region and a second peak located in the undoped region, and a peak value of the second peak is less than a peak value of the first peak.

According to the purpose of the present disclosure, the embodiment of the present disclosure further provides a display device. The display device comprises a display panel. The display panel comprises a substrate, a thin-film transistor layer disposed on the substrate, and a light-emitting device layer disposed on a side of the thin-film transistor layer away from the substrate.

The light-emitting device layer comprises:

an anode electrode disposed on the side of the thin-film transistor layer away from the substrate an organic light-emitting layer disposed on a side of the anode electrode away from the thin-film transistor layer a hole blocking layer disposed on a side of the organic light-emitting layer away from the anode electrode;

a cathode electrode disposed on a side of the hole blocking layer away from the organic light-emitting layer.

The organic light-emitting layer comprises a doped region and an undoped region, and the undoped region is located between the doped region and the hole blocking layer. When the display panel is in a low grayscale display state, an exciton concentration distribution curve of the organic light-emitting layer comprises a first peak located in the doped region and a second peak located in the undoped region, and a peak value of the second peak is less than a peak value of the first peak.

BRIEF DESCRIPTION OF DRAWINGS

The technical solutions and other beneficial effects of the present disclosure will be apparent through a detailed description of the specific embodiments of the present disclosure in conjunction with the accompanying drawings.

DETAILED DESCRIPTION OF PREFERRED EMBODIMENTS

In order to make the purpose, technical solutions and effects of the present disclosure clearer and clearer, the present disclosure will be further described in detail below with reference to the accompanying drawings and examples. It should be understood that the specific embodiments described here are only used to explain the present disclosure and are not used to limit the present disclosure.

The following disclosure provides many different embodiments or examples for implementing the various structures of the present application. To simplify the present disclosure, the components and arrangements of specific examples are described below. Of course, they are merely examples and are not intended to limit the application. Furthermore, this application may repeat reference numbers and/or reference letters in different examples, such repetition being for the purposes of simplicity and clarity and does not by itself indicate a relationship between the various embodiments and/or arrangements discussed. In addition, this application provides examples of various specific processes and materials, but one of ordinary skill in the art will recognize the application of other processes and/or the use of other materials.

Figure 1:
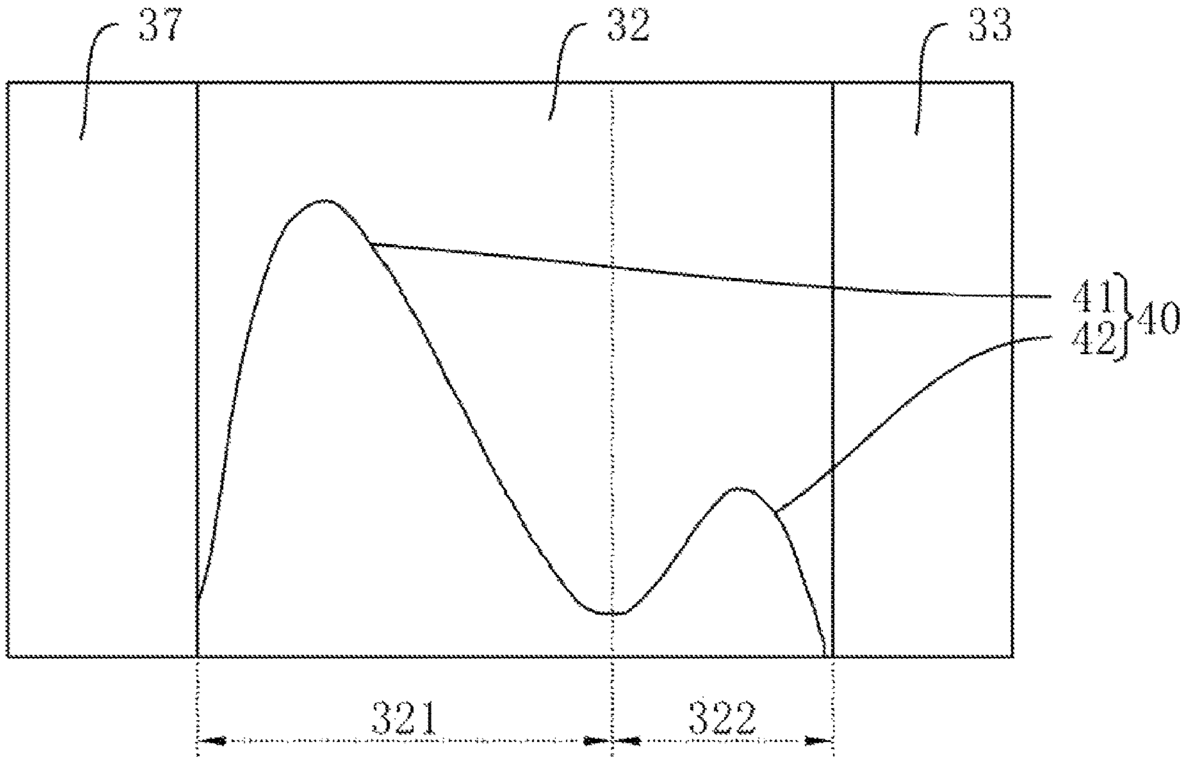
FIG. 1 is an exciton concentration distribution curve of an organic light-emitting layer under low grayscale display according to an embodiment of the present disclosure.
Figure 2:
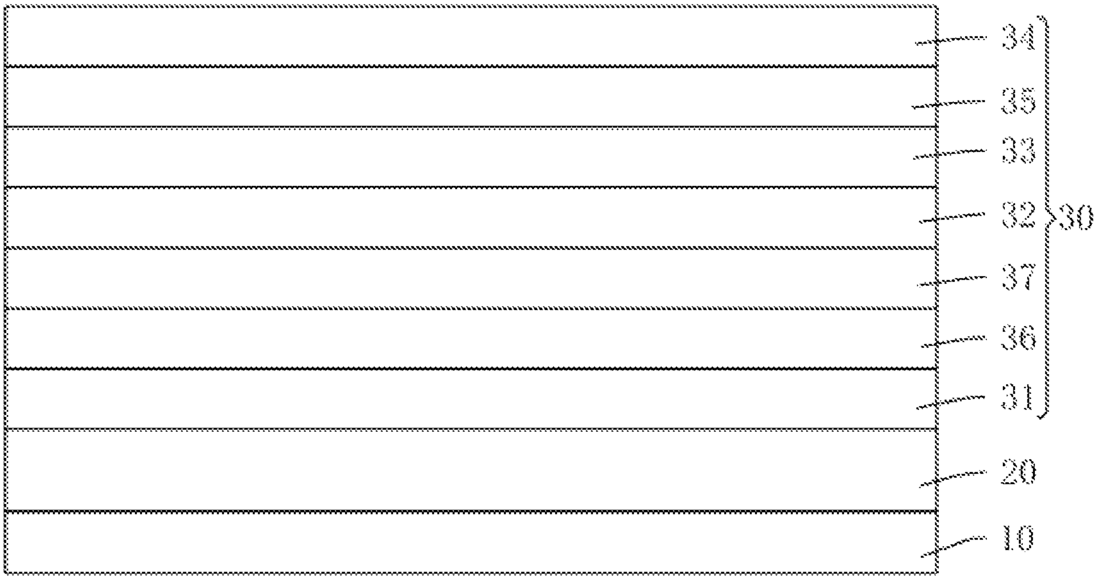
FIG. 2 is a schematic diagram of a structure of a display panel according to an embodiment of the present disclosure.

Please refer to FIG. 1 and FIG. 2, an embodiment of the present disclosure provides a display panel. The display panel comprises a substrate 10, a thin-film transistor layer 20 disposed on the substrate 10, and a light-emitting device layer 30 disposed on a side of the thin-film transistor layer 20 away from the substrate 10.

The light-emitting device layer 30 comprises an anode electrode 31, an organic light-emitting layer 32, a hole blocking layer 33, and a cathode electrode 34. The anode electrode 31 is disposed on the side of the thin-film transistor layer 20 away from the substrate 10. The organic light-emitting layer 32 is disposed on a side of the anode electrode 31 away from the thin-film transistor layer 20. The hole blocking layer 33 is disposed on a side of the organic light-emitting layer 32 away from the anode electrode 31. The cathode electrode 34 is disposed on a side of the hole blocking layer 33 away from the organic light-emitting layer 32.

Furthermore, the organic light-emitting layer 32 comprises a doped region 321 and an undoped region 322, and the undoped region 322 is located between the doped region 321 and the hole blocking layer 33. When the display panel is in a low grayscale display state, an exciton concentration distribution curve 40 of the organic light-emitting layer 32 comprises a first peak 41 located in the doped region 321 and a second peak 42 located in the undoped region 322, and a peak value of the second peak 42 is less than a peak value of the first peak 41.

In the process of implementing the application, in the embodiment of the present disclosure, the exciton concentration distribution curve 40 of the organic light-emitting layer 32 is measured through verification. The exciton concentration distribution curve 40 of the organic light-emitting layer 32 in the low grayscale display state comprises the first peak 41 and the second peak 42, and the second peak 42 is located on a side of the organic light-emitting layer 32 close to the hole blocking layer 33. Furthermore, in the embodiment of the present disclosure, a region corresponding to the second peak 42 is set to be undoped to form the undoped region 322, which reduces luminous efficiency of the light-emitting device layer 30 in the low grayscale display state, thereby avoiding display unevenness due to inaccurate current control.

Figure 3:
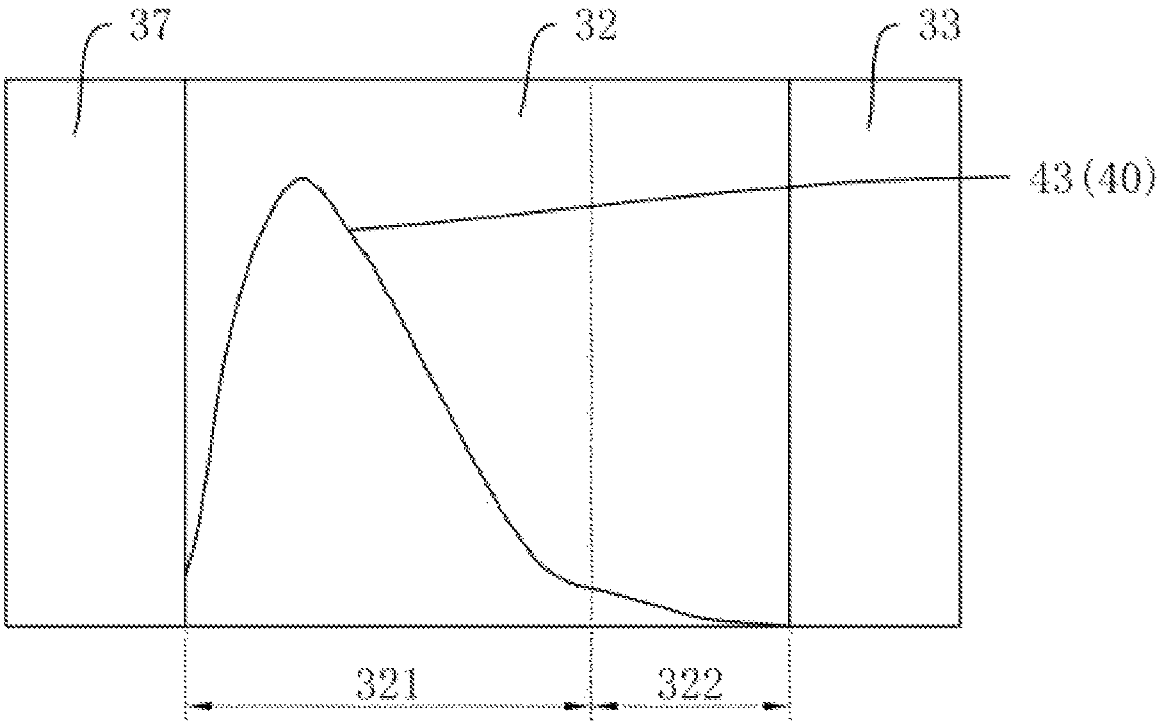
FIG. 3 is an exciton concentration distribution curve of an organic light-emitting layer under high grayscale display according to an embodiment of the present disclosure.
Figure 4:
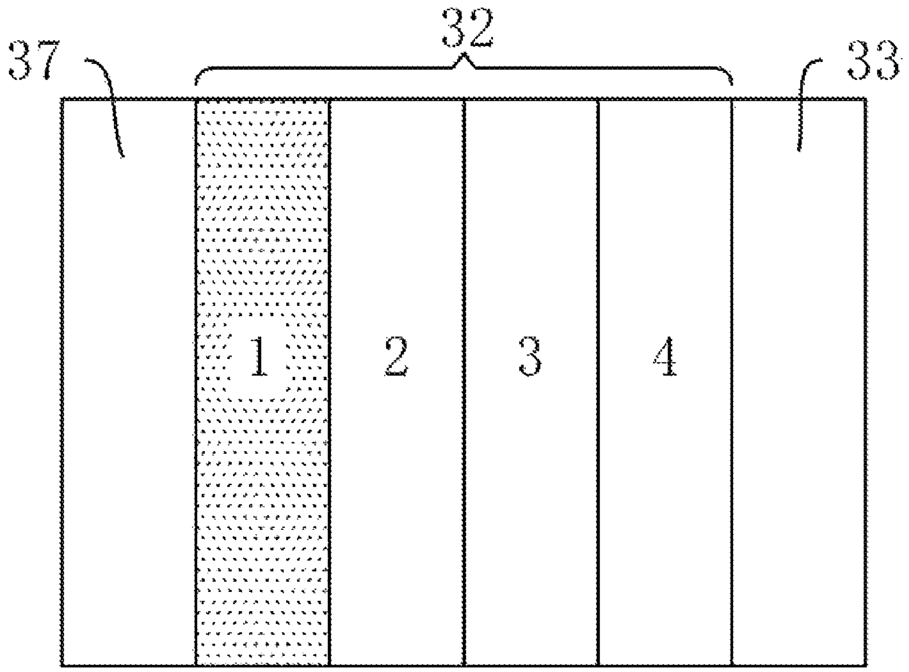
FIG. 4 to FIG. 7 are schematic diagrams of a process of measuring the exciton concentration distribution curves of the organic light-emitting layer according to an embodiment of the present disclosure.
Figure 5:
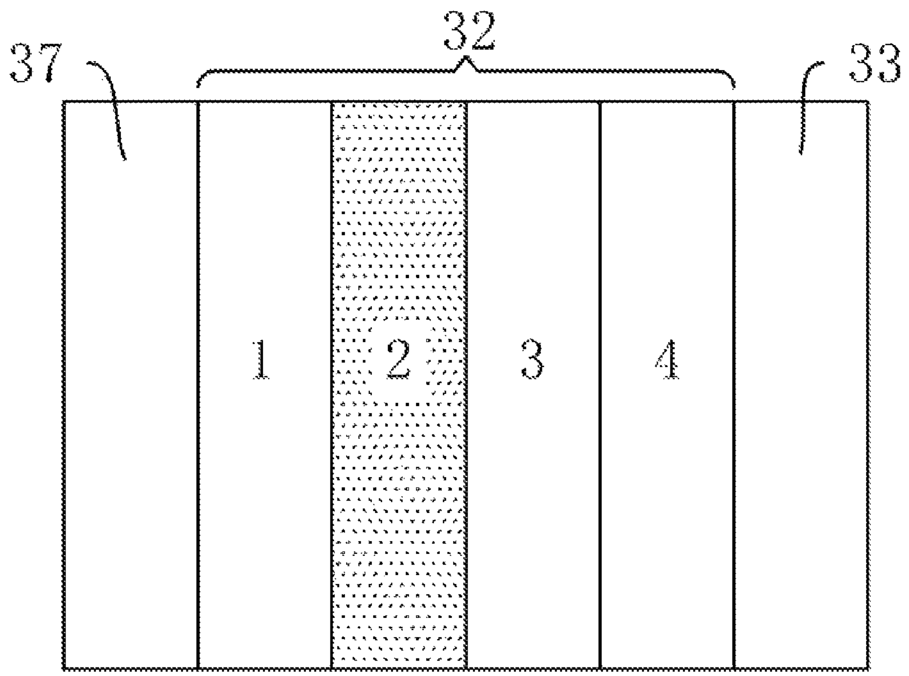
Figure 6:
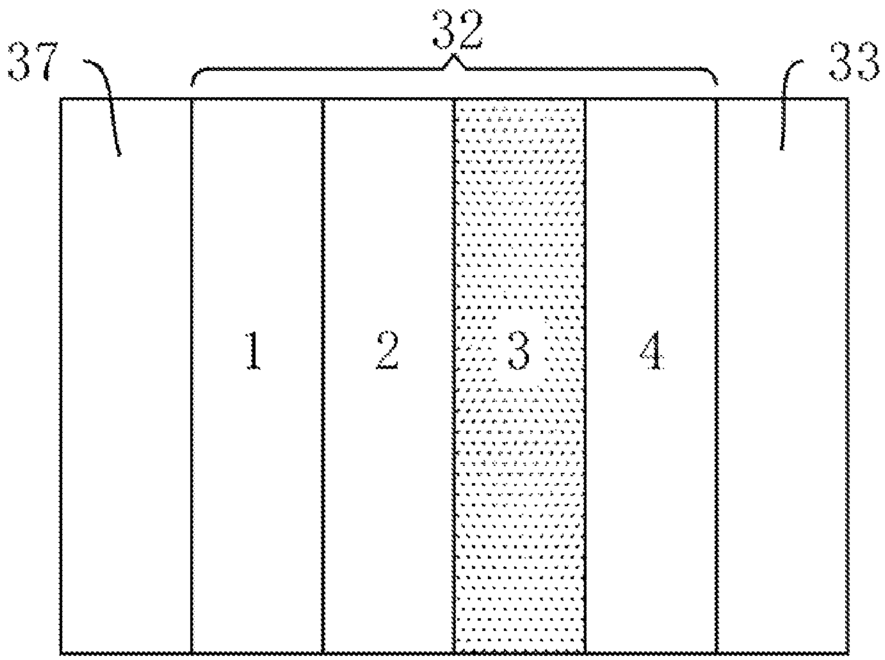
Figure 7:
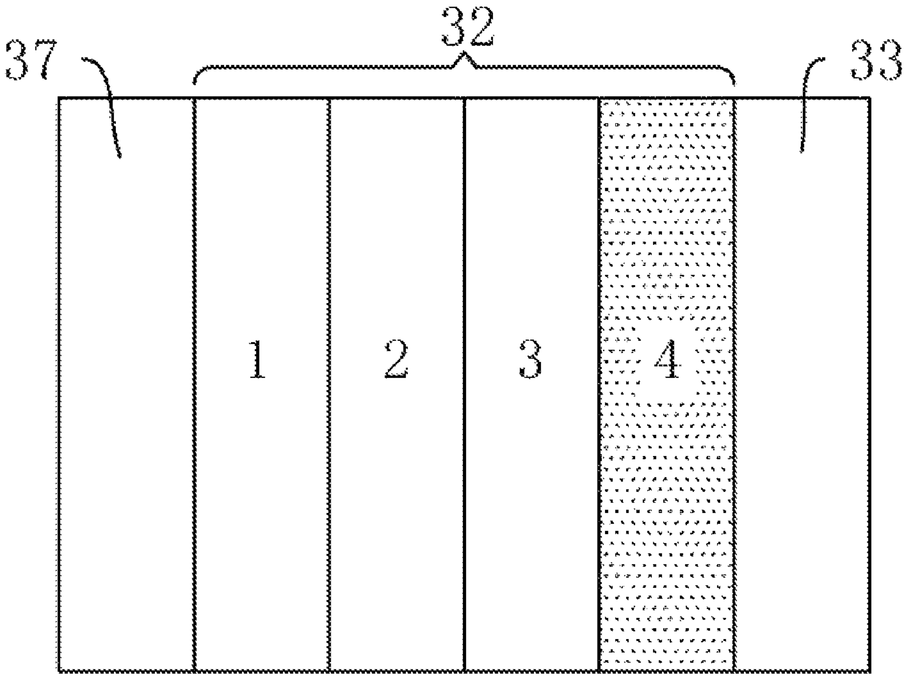

Please refer to FIG. 1, FIG. 2, and FIG. 3, the display panel provided by the embodiment of the present disclosure comprises the substrate 10, the thin-film transistor layer 20, and the light-emitting device layer 30.

The thin-film transistor layer 20 is disposed on the substrate 10. The thin film transistor layer 20 is provided with a plurality of thin film transistors arranged in an array, a plurality of scan lines, and a plurality of data lines. The scan lines and the data lines intersect to form a plurality of pixel areas. Each pixel area is provided with the thin film transistor to transmit control signals into the pixel area. For example, the scan line may be connected to a gate electrode of the thin film transistor, and the data line may be connected to a source electrode of the thin film transistor. Then, under control of the scan line, the thin film transistor transmits a data signal in the data line to the pixel area to realize a display function.

The light-emitting device layer 30 is disposed on the side of the thin-film transistor layer 20 away from the substrate 10, and the light-emitting device layer 30 comprises a plurality of light-emitting devices disposed corresponding to the pixel areas.

In one embodiment, each light-emitting device may comprise the anode electrode 31, a hole transport layer 36, an electron blocking layer 37, the organic light-emitting layer 32, the hole blocking layer 33, an electron transport layer 35, and the cathode electrode 34 disposed sequentially in a direction from the substrate 10 to the thin-film transistor layer 20.

In the embodiment of the present disclosure, the organic light-emitting layer 32 comprises the doped region 321 and the undoped region 322. The undoped region 322 is located between the doped region 321 and the hole blocking layer 33, and the doped region 321 is located between the undoped region 322 and the electronic blocking layer 37.

The organic light-emitting layer 32 comprises a host material and a light-emitting guest material, and the light-emitting guest material is doped into the host material, so that the organic light-emitting layer 32 can be excited to emit light. In the embodiment of the present disclosure, the doped region 321 is provided with a host material doped with a light-emitting guest material, and the undoped region 322 is provided with a body material without a light-emitting guest material.

When the display panel is in the low grayscale display state, the exciton concentration distribution curve 40 of the organic light-emitting layer 32 comprises the first peak 41 in the doped region 321 and the second peak 42 in the undoped region 322, and the peak value of the second peak 42 is less than the peak value of the first peak 41. This indicates that when the display panel is in the low grayscale display state, the organic light-emitting layer 32 can be excited to emit light in both the doped region 321 and the undoped region 322. However, in the embodiment of the present disclosure, no light-emitting guest material is disposed in the undoped region 322, so that exciton recombination and light emission do not occur in the undoped region 322, which can effectively reduce the luminous efficiency of the light-emitting device layer 30 in the low grayscale display state. Therefore, in the low grayscale display state, under a premise of same brightness, a larger current is required to be input. This avoids inaccurate current control due to the required current being less than a minimum current that the driving backplane can control, thereby effectively preventing the display panel from being uneven when displaying low grayscale images, and thus improving a display effect of the display panel in the low grayscale display state.

In one embodiment, when the display panel is in a high grayscale display state, an exciton concentration distribution curve 40 of the organic light-emitting layer 32 comprises a third peak 43 located in the doped region 321, and a maximum height of the exciton concentration distribution curve 40 of the organic light-emitting layer 32 in the undoped region 322 is less than or equal to 10% of a height of the third peak 43. At this time, the exciton concentration distribution curve 40 has no peak in the undoped region 322. That is, when the display panel is in the high grayscale display state, exciton recombination and light emission occur in the doped region 321 of the organic light-emitting layer 32, but exciton recombination and light emission do not occur in the undoped region 322 of the organic light-emitting layer 32. Therefore, in the present disclosure, even if the light-emitting guest material is not disposed in the undoped region 322, it will not affect luminous efficiency of the display panel in the high grayscale display state. This can ensure a luminous effect of the display panel in the high grayscale display state.

It is noted that, referring to FIG. 4 to FIG. 7 illustrating schematic diagrams of a process of measuring the exciton concentration distribution curves 40 of the organic light-emitting layer 32 according to an embodiment of the present disclosure, the organic light-emitting layer 32 may be divided into a first region 1, a second region 2, a third region 3, and a fourth region 4 arranged sequentially in a direction from the electron blocking layer 37 to the hole blocking layer 33. When only portions of the organic light-emitting layer 32 corresponding to the first region 1, the second region 2, and the third region 3 are doped with the light-emitting guest material, efficiencies of the light-emitting devices at a high current density and a low current density are very similar. This means that at high grayscales and low grayscales, exciton recombination regions in the first region 1, the second region 2, and the third region 3 are similar. That is, when the display panel performs high grayscale display and low grayscale display, the exciton concentration distribution curve 40 has the first peak 41 or the third peak 43 in the first region 1, the second region 2, and the third region 3. When only a portion of the organic light-emitting layer 32 corresponding to the fourth region 4 is doped with the light-emitting guest material, efficiency of the light-emitting devices at the low current density is greater than efficiency of the light-emitting devices at the high current density. This means that at the low current density, the fourth region 4 comprises a high exciton density distribution region. That is, when the display panel performs low grayscale display, the exciton concentration distribution curve 40 has the second peak 42 in the fourth region 4.

In the display panel provided in the embodiment of the present disclosure, in the organic light-emitting layer 32, the doped region 321 may be regarded as a combination of the first region 1, the second region 2, and the third region 3, and the undoped region 322 may be regarded as the fourth region 4. Therefore, in the embodiment of the present disclosure, the exciton concentration distribution curve 40 of the organic light-emitting layer 32 is measured through verification. The exciton concentration distribution curve 40 of the organic light-emitting layer 32 in the low grayscale display state comprises the first peak 41 and the second peak 42, and the second peak 42 is located on the side of the organic light-emitting layer 32 close to the hole blocking layer 33. Furthermore, in the embodiment of the present disclosure, the region corresponding to the second peak 42 is set to be undoped to form the undoped region 322, which reduces the luminous efficiency of the light-emitting device layer 30 in the low grayscale display state, thereby avoiding display unevenness due to inaccurate current control. At the same time, since the exciton concentration distribution curve 40 does not have a peak in the undoped region 322 when the display panel performs high grayscale display, setting the undoped region 322 will not affect the luminous efficiency of the display panel during the high grayscale display.

Furthermore, in the embodiment of the present disclosure, energy level distribution and thicknesses of the hole transport layer 36, the electron blocking layer 37, the organic light-emitting layer 32, the hole blocking layer 33, and the electron transport layer 35 are designed so that the exciton concentration distribution curve 40 of the organic light-emitting layer 32 has the first peak 41, the second peak 42, and the third peak 43.

Figure 8:
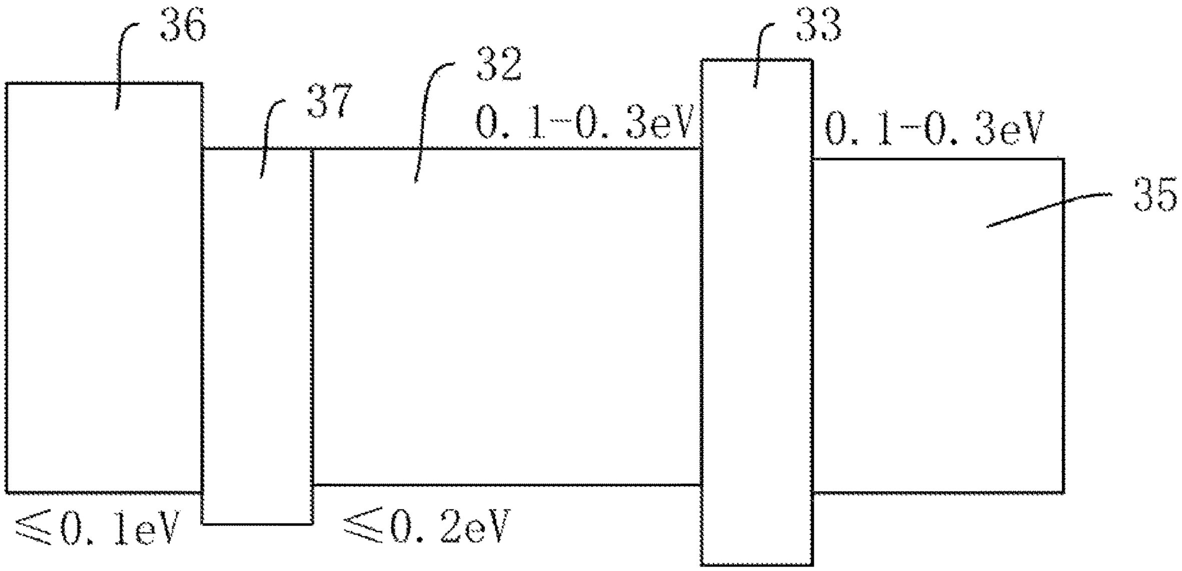
FIG. 8 is a schematic diagram of an energy level distribution of the light-emitting device layer according to an embodiment of the present disclosure.

Please refer to FIG. 8, in one embodiment of the present disclosure, a HOMO energy level of the hole transport layer 36 is greater than or equal to a HOMO energy level of the electron blocking layer 37, an absolute value of a difference between the HOMO energy level of the hole transport layer 36 and the HOMO energy level of the electron blocking layer 37 is less than or equal to 0.1 eV, the HOMO energy level of the electron blocking layer 37 is less than or equal to a HOMO energy level of the host material in the organic light-emitting layer 32, and an absolute value of a difference between the HOMO energy level of the electron blocking layer 37 and the HOMO energy level of the host material in the organic light-emitting layer 32 is less than or equal to 0.2 eV, so as to enhance hole injection.

A LUMO energy level of the hole blocking layer 33 is greater than a LUMO energy level of the electron transport layer 35, an absolute value of a difference between the LUMO energy level of the hole blocking layer 33 and the LUMO energy level of the electron transport layer 35 is greater than or equal to 0.1 eV and less than or equal to 0.3 eV, the LUMO energy level of the hole blocking layer 33 is greater the HOMO energy level of the host material in the organic light-emitting layer 32, an absolute value of a difference between the LUMO energy level of the hole blocking layer 33 and the HOMO energy level of the host material in the organic light-emitting layer 32 is greater than or equal to 0.1 eV and less than or equal to 0.3 eV, and a LUMO energy level of the host material in the organic light-emitting layer 32 is greater than the LUMO energy level of the electron transport layer 35, so as to weaken electron injection.

Furthermore, the absolute value of the difference between the HOMO energy level of the electron blocking layer 37 and the HOMO energy level of the host material in the organic light-emitting layer 32 is less than the absolute value of the difference between the LUMO energy level of the hole blocking layer 33 and the HOMO energy level of the host material in the organic light-emitting layer 32, so as to enhance the hole injection and weaken the electron injection in the light-emitting devices, so that in the low grayscale display state, the exciton concentration distribution curve 40 comprises the first peak 41 in the doped region 321 and the second peak 42 in the undoped region 322, and the peak value of the second peak 42 is less than the peak value of the first peak 41.

Figure 9:
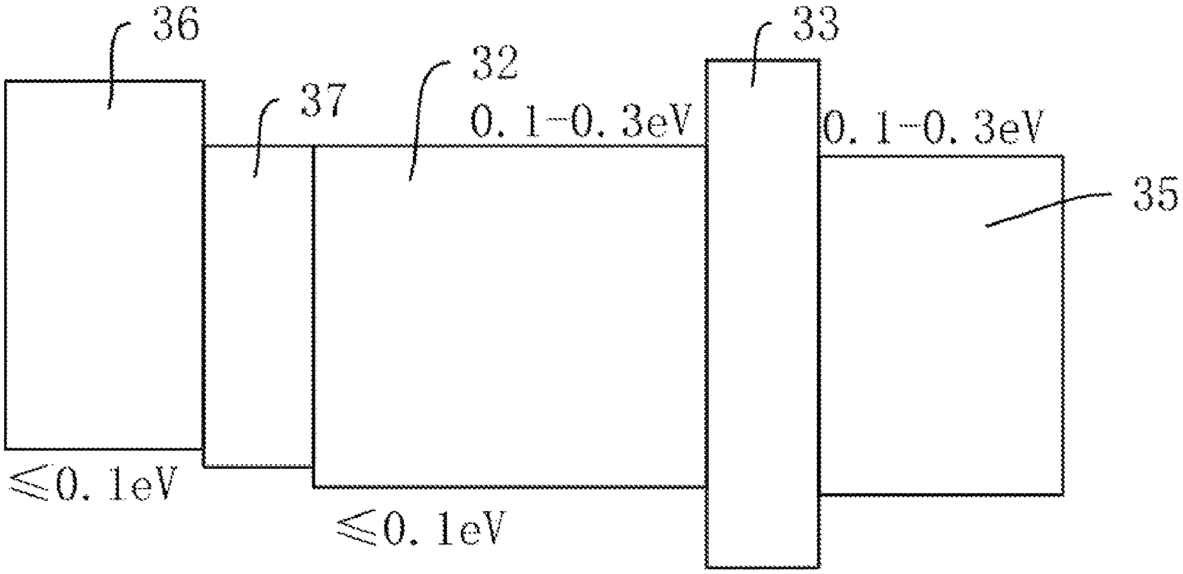
FIG. 9 is another schematic diagram of the energy level distribution of the light-emitting device layer according to an embodiment of the present disclosure.

Please refer to FIG. 9, the HOMO energy level of the hole transport layer 36, the HOMO energy level of the electron blocking layer 37, and the HOMO energy level of the host material in the organic light emitting layer 32 are sequentially arranged in a ladder shape. For example, the HOMO energy level of the hole transport layer 36 is greater than the HOMO energy level of the electron blocking layer 37, the HOMO energy level of the electron blocking layer 37 is greater than the HOMO energy level of the host material in the organic light-emitting layer 32, and an absolute value of an energy level difference between two adjacent layers is less than or equal to 0.1 eV, so as to facilitate hole injection.

The LUMO energy level of the hole blocking layer 33 is greater than the LUMO energy level of the electron transport layer 35, the absolute value of the difference between the LUMO energy level of the hole blocking layer 33 and the LUMO energy level of the electron transport layer 35 is greater than or equal to 0.1 eV and less than or equal to 0.3 eV, the LUMO energy level of the hole blocking layer 33 is greater the HOMO energy level of the host material in the organic light-emitting layer 32, the absolute value of the difference between the LUMO energy level of the hole blocking layer 33 and the HOMO energy level of the host material in the organic light-emitting layer 32 is greater than or equal to 0.1 eV and less than or equal to 0.3 eV, and the LUMO energy level of the host material in the organic light-emitting layer 32 is greater than the LUMO energy level of the electron transport layer 35, so as to weaken electron injection.

Furthermore, the absolute value of the difference between the HOMO energy level of the electron blocking layer 37 and the HOMO energy level of the host material in the organic light-emitting layer 32 is less than the absolute value of the difference between the LUMO energy level of the hole blocking layer 33 and the HOMO energy level of the host material in the organic light-emitting layer 32, so as to enhance the hole injection and weaken the electron injection in the light-emitting devices, so that in the low grayscale display state, the exciton concentration distribution curve 40 comprises the first peak 41 in the doped region 321 and the second peak 42 in the undoped region 322, and the peak value of the second peak 42 is less than the peak value of the first peak 41.

It is noted that the hole blocking layer 33 forms a larger energy level barrier between the organic light-emitting layer 32 and the electron transport layer 35, which provides a basis for enhancing hole injection, weakening electron injection, and forming the exciton concentration distribution curve 40 having the first peak 41 and the second peak 42.

According to the embodiments of the present disclosure, when the LUMO energy level of the hole blocking layer 33 increases, the absolute value of the difference between the LUMO energy level of the hole blocking layer 33 and the HOMO energy level of the host material in the organic light-emitting layer 32 increases, so that a carrier balance in the organic light-emitting layer 32 is biased toward excess holes. At this time, a thickness of the undoped region 322 in the organic light-emitting layer 32 may be reduced. When the LUMO energy level of the hole blocking layer 33 decreases, the absolute value of the difference between the LUMO energy level of the hole blocking layer 33 and the HOMO energy level of the host material in the organic light-emitting layer 32 decreases, so that the carrier balance in the organic light-emitting layer 32 is biased toward excess electrons. At this time, the thickness of the undoped region 322 in the organic light-emitting layer 32 may be increased.

The thickness of the undoped region 322 in the organic light-emitting layer 32 decreases as the LUMO energy level of the hole blocking layer 33 increases. The thickness of the undoped region 322 in the organic light-emitting layer 32 increases as the LUMO energy level of the hole blocking layer 33 decreases.

In one embodiment, a ratio of the thickness of the undoped region 322 in the organic light-emitting layer 32 to a thickness of the organic light-emitting layer 32 is greater than 0% and less than or equal to 60%. Specifically, the thickness of the undoped region 322 in the organic light-emitting layer 32 and the LUMO energy level of the hole blocking layer 33 may satisfy the following conditions.

In one embodiment, the absolute value of the difference between the LUMO energy level of the hole blocking layer 33 and the HOMO energy level of the host material in the organic light-emitting layer 32 is greater than or equal to 0.1 eV and less than or equal to 0.3 eV. At this time, the carrier balance in the organic light-emitting layer 32 is better, and the ratio of the thickness of the undoped region 322 in the organic light-emitting layer 32 to the thickness of the organic light-emitting layer 32 is greater than or equal to 10% and less than or equal to 20%.

Figure 10:
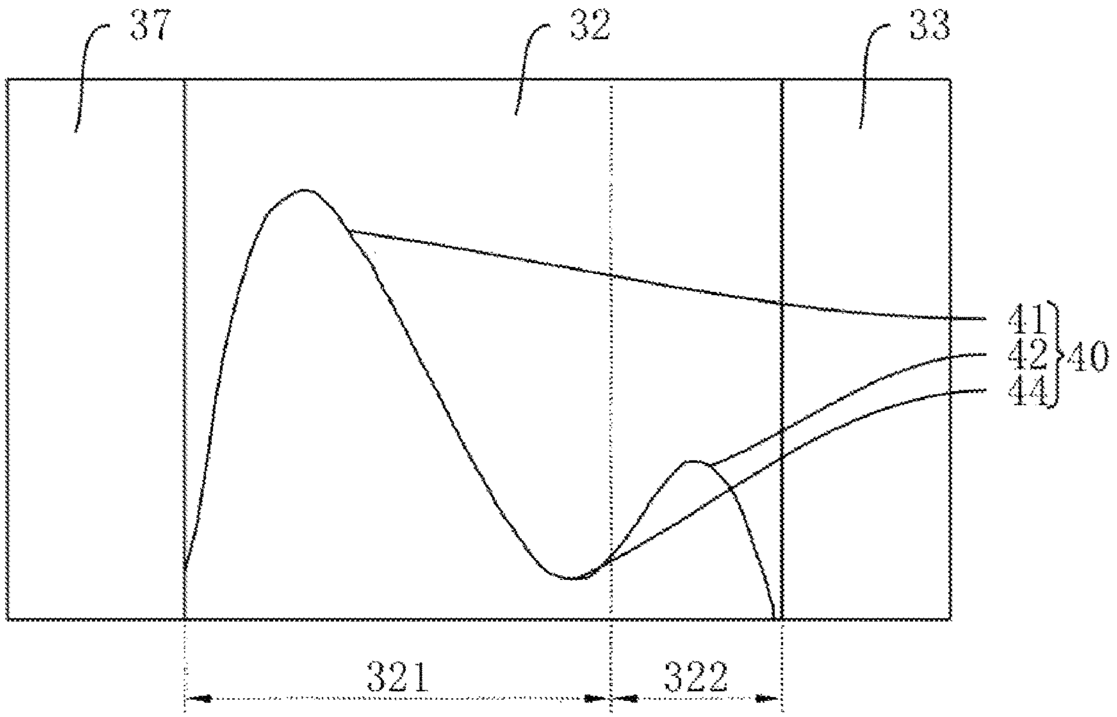
FIG. 10 is another exciton concentration distribution curve of an organic light-emitting layer under low grayscale display according to an embodiment of the present disclosure.

In one embodiment, the absolute value of the difference between the LUMO energy level of the hole blocking layer 33 and the HOMO energy level of the host material in the organic light-emitting layer 32 is greater than 0.3 eV. At this time, the carrier balance in the organic light-emitting layer 32 is biased toward excess holes, and the ratio of the thickness of the undoped region 322 in the organic light-emitting layer 32 to the thickness of the organic light-emitting layer 32 is greater than or equal to 2% and less than 10%. Furthermore, please refer to FIG. 10, when the display panel is in the low grayscale display state, the exciton concentration distribution curve 40 of the organic light-emitting layer 32 further comprises a first trough 44 between the first peak 41 and the second peak 42. The absolute value of the difference between the LUMO energy level of the hole blocking layer 33 and the HOMO energy level of the host material in the organic light-emitting layer 32 is greater than 0.3 eV. A contact surface between the doped region 321 and the undoped region 322 is between the first trough 44 and the second peak 42.

Figure 11:
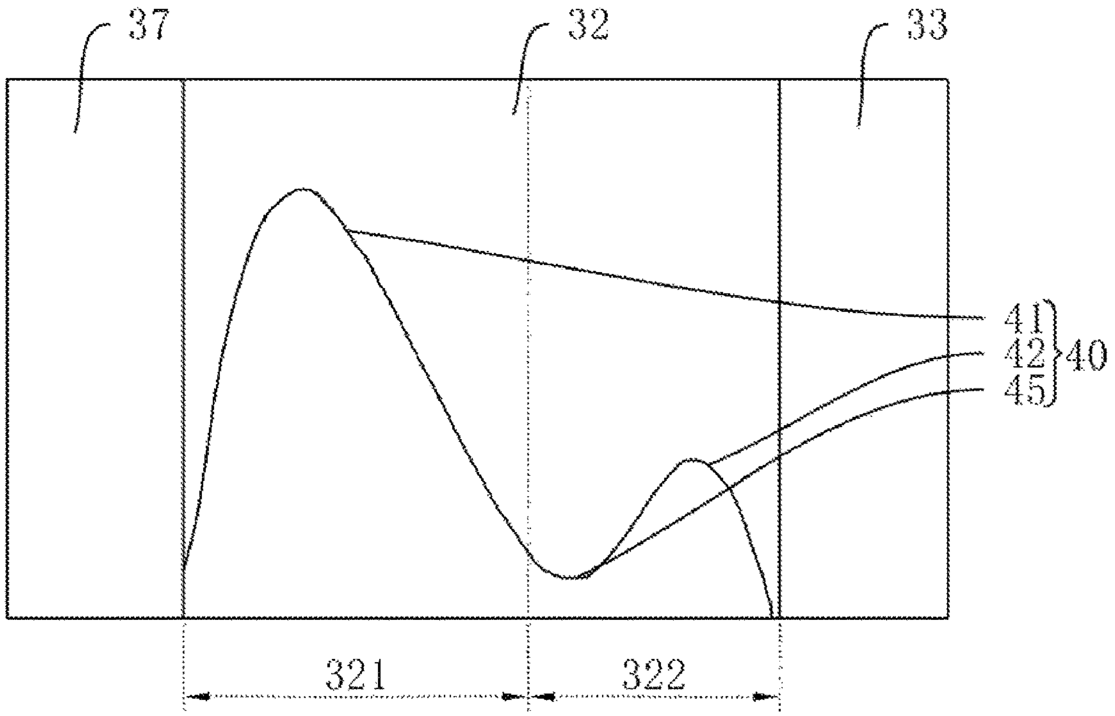
FIG. 11 is another exciton concentration distribution curve of an organic light-emitting layer under low grayscale display according to an embodiment of the present disclosure.

In one embodiment, the absolute value of the difference between the LUMO energy level of the hole blocking layer 33 and the HOMO energy level of the host material in the organic light-emitting layer 32 is less than 0.1 eV. At this time, the carrier balance in the organic light-emitting layer 32 is biased toward excess electrons, and the ratio of the thickness of the undoped region 322 in the organic light-emitting layer 32 to the thickness of the organic light-emitting layer 32 is greater than 20% and less than or equal to 30%. Furthermore, please refer to FIG. 11, when the display panel is in the low grayscale display state, the exciton concentration distribution curve 40 of the organic light-emitting layer 32 further comprises a second trough 45 between the first peak 41 and the second peak 42. The absolute value of the difference between the LUMO energy level of the hole blocking layer 33 and the HOMO energy level of the host material in the organic light-emitting layer 32 is less than 0.1 eV. The contact surface between the doped region 321 and the undoped region 322 is between the second trough 45 and the first peak 41.

Furthermore, in the embodiment of the present disclosure, a position of the undoped region 322 in the organic light-emitting layer 32 is adjusted and measured to verify luminous efficiency of the light-emitting devices when the undoped region 322 is located at different positions in the organic light-emitting layer 32.

The embodiment of the present disclosure provides a comparative example and Example 1 to Example 3. In the comparative example, the organic light-emitting layer 32 is a uniformly doped layer.

In Example 1, the thickness of the undoped region 322 in the organic light-emitting layer 32 is 5 nm, and the undoped region 322 is located on the side of the organic light-emitting layer 32 close to the hole blocking layer 33 and is connected with the hole blocking layer 33.

In Example 2, the thickness of the undoped region 322 in the organic light-emitting layer 32 is 5 nm, and the undoped region 322 is located in a middle of the organic light-emitting layer 32.

In Example 3, the thickness of the undoped region 322 in the organic light-emitting layer 32 is 5 nm, and the undoped region 322 is located on a side of the organic light-emitting layer 32 close to the electron blocking layer 37 and is connected with the electron blocking layer 37.

In the embodiment of the present disclosure, a process of manufacturing the light-emitting device comprises the following steps.

The anode electrode 31 is made of ITO. The hole transport layer 36 is made of NPB and has a thickness of 120 nm. The electron blocking layer 37 is made of TCTA and has a thickness of 40 nm. The organic light-emitting layer 32 has a thickness of 40 nm, the host material is mCBP, the light-emitting guest material is Ir(ppy)3, and a doping concentration of the light-emitting guest material in the host material is 6%. The electron transport layer 35 is made of TPBi and has a thickness of 35 nm. The cathode electrode 34 is a Mg:Ag (1:10) mixed electrode and has a thickness of 12 nm. When manufacturing the device, an evaporation deposition rate of organic materials is 1 A/s, and an evaporation deposition rate of metal materials is 2 A/s. The above organic materials have the following chemical structure:

NPB

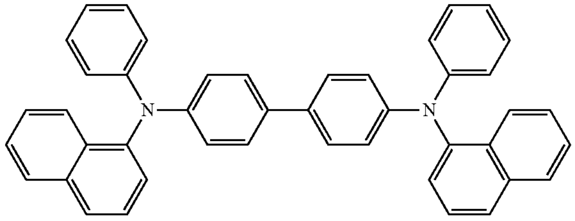

TPBi

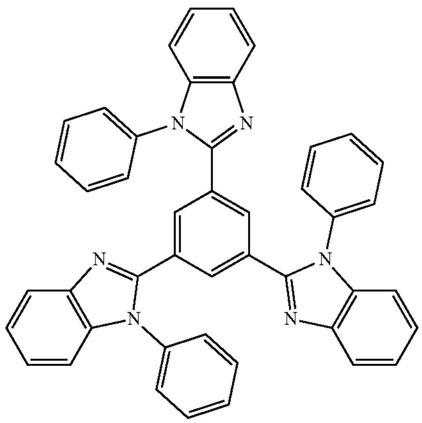

-continued

TCTA

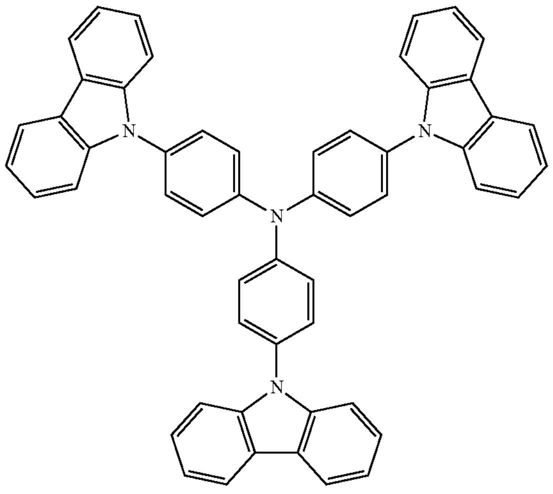

Irppy3

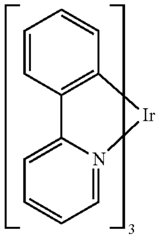

mCBP

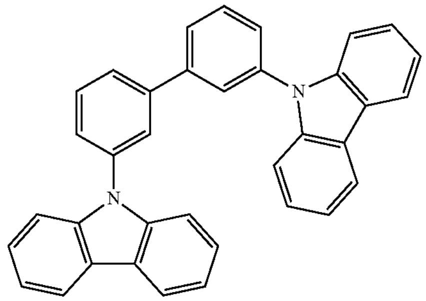

It can be understood that in the examples, the positions and thicknesses of the doped region 321 and the undoped region 322 in the organic light-emitting layer 32 are set to be different to obtain Examples 1, 2, and 3.

In the embodiment of the present disclosure, luminous efficiencies of the light-emitting devices in the comparative example, Example 1, Example 2, and Example 3 are calculated at brightness of 0.5 nits, 2 nits, 10 nits, 2000 nits, and 20000 nits and recorded as $CE_{0.5}$, $CE_{2.0}$, $CE_{10}$, $CE_{2k}$, and $CE_{20k}$, respectively. When a brightness of the light-emitting device is less than or equal to 10 nits, the display panel may be considered to be in the low grayscale display state. After measurement and calculation, the following Table 1 is obtained.

TABLE 1

| | Voltage @J10 | LT95 @J50 | $CE_{0.5}$ | $CE_{2.0}$ | $CE_{10}$ | $CE_{2k}$ | $CE_{20k}$ |
|---|---|---|---|---|---|---|---|
| Comparative example | 3.45 | 89 | 166 | 175 | 172 | 170 | 167 |

TABLE 1-continued

| | Voltage @J10 | LT95 @J50 | $CE_{0.5}$ | $CE_{2.0}$ | $CE_{10}$ | $CE_{2k}$ | $CE_{20k}$ |
|---|---|---|---|---|---|---|---|
| Example 1 | 3.47 | 88 | 89 | 124 | 156 | 169 | 164 |
| Example 2 | 3.43 | 79 | 126 | 131 | 135 | 134 | 128 |
| Example 3 | 3.45 | 80 | 105 | 107 | 106 | 102 | 95 |

J10 and J50 represent current densities of 10 mA/$cm^3$ and 50 mA/$cm^3$, respectively. LT95 represents a time for a brightness to decay to 95% of an initial brightness, and its unit is hours.

It can be seen from Table 1, Example 1 can reduce the luminous efficiency of the light-emitting device in the low grayscale display state, while maintaining the luminous efficiency of the light-emitting device in the high grayscale display state. That is, when the undoped region 322 is located on the side of the organic light-emitting layer 32 close to the hole blocking layer 33, it can be satisfied that: in the low grayscale display state, the luminous efficiency of the light-emitting device is reduced, while in the high grayscale display state, the luminous efficiency of the light-emitting device is maintained. This can effectively avoid display unevenness due to inaccurate current control, and can also avoid affecting the luminous efficiency of the display panel in the high grayscale display state.

Furthermore, in the embodiment of the present disclosure, the thickness of the undoped region 322 in the organic light-emitting layer 32 is further adjusted and measured to verify luminous efficiency of the light-emitting devices when the thickness of the undoped region 322 in the organic light-emitting layer 32 is different.

The embodiment of the present disclosure provides Example 4 to Example 8, in which the undoped region 322 are all located on the side of the organic light-emitting layer 32 close to the hole blocking layer 33.

In Example 4, the thickness of the undoped region 322 in the organic light-emitting layer 32 is 1 nm. In Example 5, the thickness of the undoped region 322 in the organic light-emitting layer 32 is 3 nm. In Example 6, the thickness of the undoped region 322 in the organic light-emitting layer 32 is 7 nm. In Example 7, the thickness of the undoped region 322 in the organic light-emitting layer 32 is 10 nm. In Example 8, the thickness of the undoped region 322 in the organic light-emitting layer 32 is 20 nm. After measurement and calculation, the following Table 1 is obtained.

TABLE 2

| | Voltage @J10 | LT95 @J50 | $CE_{0.5}$ | $CE_{2.0}$ | $CE_{10}$ | $CE_{2k}$ | $CE_{20k}$ |
|---|---|---|---|---|---|---|---|
| Comparative example | 3.45 | 89 | 166 | 175 | 172 | 170 | 167 |
| Example 4 | 3.45 | 87 | 168 | 173 | 174 | 171 | 168 |
| Example 5 | 3.48 | 88 | 101 | 146 | 160 | 168 | 165 |
| Example 2 | 3.47 | 88 | 89 | 124 | 156 | 169 | 164 |
| Example 6 | 3.46 | 82 | 85 | 120 | 149 | 169 | 164 |
| Example 7 | 3.50 | 75 | 79 | 115 | 140 | 164 | 160 |
| Example 8 | 3.55 | 40 | 70 | 79 | 81 | 82 | 77 |

It can be seen from Table 2 that as the thickness of the undoped region 322 in the organic light-emitting layer 32 increases, the luminous efficiency of the light-emitting device in the low grayscale display state gradually decreases. When the thickness of the undoped region 322 in the organic light-emitting layer 32 exceeds 10 nm, the luminous efficiency of the light-emitting device in the high grayscale display state also begins to be affected. When the thickness of the undoped region 322 in the organic light-emitting layer 32 is less than 3 nm, a control effect on the luminous efficiency of the light-emitting device in the low grayscale display state is limited. Therefore, the thickness of the undoped region 322 in the organic light-emitting layer 32 is greater than or equal to 3 nm and less than or equal to 10 nm, so as to meet a requirement of reducing the luminous efficiency in the low grayscale display state without affecting the luminous efficiency in the high grayscale display state.

In the above, in the embodiment of the present disclosure, the undoped region 322 is located on the side of the organic light-emitting layer 32 close to the hole blocking layer 33, and the undoped region 322 is not provided with the light-emitting guest material, so that the exciton recombination and the light emission do not occur in the undoped region 322, which can effectively reduce the luminous efficiency of the light-emitting device layer 30 in the low grayscale display state. Therefore, in the low grayscale display state, under a premise of same brightness, a larger current is required to be input. This avoids inaccurate current control due to the required current being less than a minimum current that the driving backplane can control, thereby effectively preventing the display panel from being uneven when displaying low grayscale images, and thus improving a display effect of the display panel in the low grayscale display state without affecting the luminous efficiency of the display panel when displaying high grayscale images.

In addition, an embodiment of the present disclosure further provides a display device. The display device comprises the display panel as described in the above embodiment.

Since the display device provided by the embodiment of the present disclosure has the same display panel as in the above embodiment, the display device has the same beneficial effects as the display panel described in the above embodiment, which will not be described again.

In the above embodiments, each embodiment is described with its own emphasis. For parts that are not described in detail in a certain embodiment, please refer to the relevant descriptions of other embodiments.

The display panel and the display device provided by the embodiments of the present disclosure are described in detail above. The present disclosure uses specific examples to describe principles and embodiments of the present disclosure. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A display panel, comprising:

a substrate;

a thin-film transistor layer disposed on the substrate; and a light-emitting device layer disposed on a side of the thin-film transistor layer away from the substrate and comprising:

an anode electrode disposed on the side of the thin-film transistor layer away from the substrate;

an organic light-emitting layer disposed on a side of the anode electrode away from the thin-film transistor layer;

a hole blocking layer disposed on a side of the organic light-emitting layer away from the anode electrode; and a cathode electrode disposed on a side of the hole blocking layer away from the organic light-emitting layer;

wherein the organic light-emitting layer comprises a doped region and an undoped region, and the undoped region is located between the doped region and the hole blocking layer; and when the display panel is in a low grayscale display state, an exciton concentration distribution curve of the organic light-emitting layer comprises a first peak located in the doped region and a second peak located in the undoped region, and a peak value of the second peak is less than a peak value of the first peak.

2. The display panel according to claim 1, wherein the organic light-emitting layer comprises a host material, the light-emitting device layer further comprises an electron transport layer disposed between the hole blocking layer and the cathode electrode, a LUMO energy level of the hole blocking layer is greater than a HOMO energy level of the host material, and the LUMO energy level of the hole blocking layer is greater than a LUMO energy level of the electron transport layer.

3. The display panel according to claim 2, wherein the light-emitting device layer further comprises an electron blocking layer disposed between the organic light-emitting layer and the anode electrode, and a HOMO energy level of the electron blocking layer is less than or equal to the HOMO energy level of the host material.

4. The display panel according to claim 3, wherein an absolute value of a difference between the HOMO energy level of the electron blocking layer and the HOMO energy level of the host material is less than an absolute value of a difference between the LUMO energy level of the hole blocking layer and the HOMO energy level of the host material.

5. The display panel according to claim 3, wherein an absolute value of a difference between the HOMO energy level of the electron blocking layer and the HOMO energy level of the host material is less than or equal to 0.2 eV.

6. The display panel according to claim 2, wherein an absolute value of a difference between the LUMO energy level of the hole blocking layer and the HOMO energy level of the host material is greater than or equal to 0.1 eV and less than or equal to 0.3 eV, and a ratio of a thickness of the undoped region in the organic light-emitting layer to a thickness of the organic light-emitting layer is greater than or equal to 10%, and less than or equal to 20%.

7. The display panel according to claim 2, wherein an absolute value of a difference between the LUMO energy level of the hole blocking layer and the HOMO energy level of the host material is greater than 0.3 eV, and a ratio of a thickness of the undoped region in the organic light-emitting layer to a thickness of the organic light-emitting layer is greater than or equal to 2%, and less than 10%.

8. The display panel according to claim 7, wherein when the display panel is in the low grayscale display state, the exciton concentration distribution curve of the organic light-emitting layer further comprises a first trough located between the first peak and the second peak; and the absolute value of the difference between the LUMO energy level of the hole blocking layer and the HOMO energy level of the host material is greater than 0.3 eV, and a contact surface between the doped region and the undoped region is between the first trough and the second peak.

9. The display panel according to claim 2, wherein an absolute value of a difference between the LUMO energy level of the hole blocking layer and the HOMO energy level of the host material is less than 0.1 eV, and a ratio of a thickness of the undoped region in the organic light-emitting layer to a thickness of the organic light-emitting layer is greater than 20% and less than or equal to 30%.

10. The display panel according to claim 9, wherein when the display panel is in the low grayscale display state, the exciton concentration distribution curve of the organic light-emitting layer further comprises a second trough located between the first peak and the second peak;

the absolute value of the difference between the LUMO energy level of the hole blocking layer and the HOMO energy level of the host material is less than 0.1 eV, and a contact surface between the doped region and the undoped region is between the second trough and the first peak.

11. The display panel according to claim 1, wherein a thickness of the undoped region in the organic light-emitting layer decreases as a LUMO energy level of the hole blocking layer increases.

12. The display panel according to claim 1, wherein a thickness of the undoped region in the organic light-emitting layer increases as a LUMO energy level of the hole blocking layer decreases.

13. The display panel according to claim 1, wherein a ratio of a thickness of the undoped region in the organic light-emitting layer to a thickness of the organic light-emitting layer is greater than 0% and less than or equal to 60%.

14. The display panel according to claim 1, wherein a thickness of the undoped region in the organic light-emitting layer is greater than or equal to 3 nm and less than or equal to 10 nm.

15. The display panel according to claim 1, wherein the organic light-emitting layer further comprises a light-emitting guest material, the host material is disposed in the doped region and the undoped region, and the light-emitting guest material is disposed in the doped region.

16. The display panel according to claim 1, wherein when the display panel is in a high grayscale display state, the exciton concentration distribution curve of the organic light-emitting layer comprises a third peak located in the doped region, and a maximum height of the exciton concentration distribution curve of the organic light-emitting layer in the undoped region is less than or equal to 10% of a height of the third peak.

17. A display device, comprising a display panel, wherein the display panel comprises a substrate, a thin-film transistor layer disposed on the substrate, and a light-emitting device layer disposed on a side of the thin-film transistor layer away from the substrate; and the light-emitting device layer comprises:

an anode electrode disposed on the side of the thin-film transistor layer away from the substrate;

an organic light-emitting layer disposed on a side of the anode electrode away from the thin-film transistor layer;

a hole blocking layer disposed on a side of the organic light-emitting layer away from the anode electrode; and a cathode electrode disposed on a side of the hole blocking layer away from the organic light-emitting layer;

wherein the organic light-emitting layer comprises a doped region and an undoped region, and the undoped region is located between the doped region and the hole blocking layer; and when the display panel is in a low grayscale display state, an exciton concentration distribution curve of the organic light-emitting layer comprises a first peak located in the doped region and a second peak located in the undoped region, and a peak value of the second peak is less than a peak value of the first peak.

18. The display device according to claim 17, wherein the organic light-emitting layer comprises a host material, the light-emitting device layer further comprises an electron transport layer disposed between the hole blocking layer and the cathode electrode, a LUMO energy level of the hole blocking layer is greater than a HOMO energy level of the host material, and the LUMO energy level of the hole blocking layer is greater than a LUMO energy level of the electron transport layer.

19. The display device according to claim 18, wherein the light-emitting device layer further comprises an electron blocking layer disposed between the organic light-emitting layer and the anode electrode, and a HOMO energy level of the electron blocking layer is less than or equal to the HOMO energy level of the host material.

20. The display device according to claim 19, wherein an absolute value of a difference between the HOMO energy level of the electron blocking layer and the HOMO energy level of the host material is less than an absolute value of a difference between the LUMO energy level of the hole blocking layer and the HOMO energy level of the host material.

* * * * *